(12) United States Patent
Starkey et al.

(10) Patent No.: US 9,878,331 B2
(45) Date of Patent: *Jan. 30, 2018

(54) DETECTING PASSING OF UNINTENDED OBJECTS THROUGH THROAT OF UNDER-SINK DISPOSAL

(71) Applicant: SAMELIN INNOVATIONS, LLC, Wilmington, NC (US)

(72) Inventors: Michael Starkey, Kent, OH (US); Raeshon Lamont McNeil, Charlotte, NC (US); Juan Carlos Perez, Charlotte, NC (US); Lloyd S. Riggs, Auburn, AL (US); Aubrey N. Beal, Scottsboro, AL (US)

(73) Assignee: SAMELIN INNOVATIONS, LLC, Wilmington, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/600,819

(22) Filed: May 22, 2017

(65) Prior Publication Data

US 2017/0259272 A1 Sep. 14, 2017

Related U.S. Application Data

(63) Continuation of application No. 14/896,435, filed as application No. PCT/US2015/036847 on Jun. 20, 2015, now Pat. No. 9,694,364.

(Continued)

(51) Int. Cl.
*B02C 18/00* (2006.01)
*G01V 3/10* (2006.01)

(Continued)

(52) U.S. Cl.
CPC ...... *B02C 18/0092* (2013.01); *B02C 18/0084* (2013.01); *B02C 23/04* (2013.01);

(Continued)

(58) Field of Classification Search
CPC .. B02C 18/0084; B02C 18/0092; B02C 23/04

(Continued)

(56) References Cited

U.S. PATENT DOCUMENTS 3,758,849 A * 9/1973 Susman ................. G01V 3/107
324/225
7,533,835 B2 * 5/2009 Hanson ................... B02C 18/16
241/33

(Continued)

*Primary Examiner* — Faye Francis
(74) *Attorney, Agent, or Firm* — Tillman Wright, PLLC; Chad D. Tillman

(57) ABSTRACT

An under-sink disposal unit includes a motor, a disposal chamber, and a disposal throat. The disposal throat extends from the disposal chamber to an opening in a top of the disposal unit and defines a passageway through which objects pass into the disposal chamber for grinding. The disposal unit further includes a coil assembly including an arrangement of coils. The arrangement of coils is used to detect the passing of a metallic object in the passageway through the disposal throat. Furthermore, the arrangement of coils includes at least one coil having a loop that is oriented with respect to an axis of the passageway through the disposal throat such that objects passing through the disposal throat into the disposal chamber pass by and proximate to, but do not pass through, such loop. Preferably DC injection braking is used to stop the motor upon detection of a metallic object.

20 Claims, 12 Drawing Sheets

Related U.S. Application Data

(60) Provisional application No. 62/165,887, filed on May 22, 2015.

(51) Int. Cl.
   *B02C 23/36* (2006.01)
   *B02C 25/00* (2006.01)
   *E03C 1/266* (2006.01)
   *G01V 3/00* (2006.01)
   *B02C 23/04* (2006.01)

(52) U.S. Cl.
   CPC .............. *B02C 23/36* (2013.01); *B02C 25/00* (2013.01); *E03C 1/2665* (2013.01); *G01V 3/00* (2013.01); *G01V 3/104* (2013.01); *B02C 2201/06* (2013.01)

(58) Field of Classification Search
   USPC ........................................ 241/46.013–46.016
   See application file for complete search history.

(56) References Cited

U.S. PATENT DOCUMENTS

| | | | | |
|---|---|---|---|---|
| 8,789,776 | B2 * | 7/2014 | Lee | E03C 1/2665 241/30 |
| 9,194,113 | B1 * | 11/2015 | Melin | B02C 23/04 |
| 9,694,364 | B2 * | 7/2017 | Starkey | G01V 3/104 |
| 2004/0000904 | A1 * | 1/2004 | Cotter | B65F 1/1607 324/239 |
| 2007/0181718 | A1 * | 8/2007 | Hanson | B02C 18/16 241/36 |
| 2010/0133370 | A1 * | 6/2010 | Flynn | B02C 18/0092 241/46.01 |

\* cited by examiner

Normal Operation

DC Injection Braking

DETECTING PASSING OF UNINTENDED OBJECTS THROUGH THROAT OF UNDER-SINK DISPOSAL

CROSS-REFERENCE TO RELATED APPLICATIONS

The present application is a continuation of, and claims the benefit of priority under 35 U.S.C. 120 to, U.S. national stage patent application Ser. No. 14/896,435, now U.S. Pat. No. 9,694,364, corresponding to PCT/US2015/036847, filed Jun. 20, 2015, which in turn is a nonprovisional of, and claims the benefit of priority under 35 U.S.C. 119 to, U.S. provisional patent application 62/165,887, filed May 22, 2015, now expired. The disclosure of the provisional patent application is incorporated by reference herein.

COMPUTER PROGRAM LISTING

Submitted concurrently herewith via the USPTO's electronic filing system, and incorporated herein by reference, are computer program files including instructions, routines, and/or other contents of several computer programs. A table setting forth the name and size of files included in the computer program listing is included below.

| File Name | Creation Date | File Size (bytes) |
| --- | --- | --- |
| ASCIFY.txt | 5/22/2015 15:18 | 37473 |
| FILES.TXT | 5/22/2015 15:18 | 1289487 |
| readme.txt | 5/22/2015 15:18 | 2591 |

One of these files, "readme.txt", contains instructions for extracting information from another of the files. This other file represents a compressed binary file that has been converted to ascii format. This file can be converted back to a compressed .zip archive utilizing an assembly conversion program source code for which is contained in "ascify.txt". The readme file includes instructions for compiling and running this conversion program, and instructions for converting the other text files to a compressed, binary file.

This compressed, binary file includes eDrawings files representing computer models. These files can be opened using eDrawings software available from Dassault Systémes SOLIDWORKS Corp.

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE INVENTION

The present invention generally relates to under-sink disposals. Such disposals are commonly found in most U.S. homes, and are designed to shred organic material prior to entering a sewer system. A conventional under-sink disposal is shown, for example, in FIG. 17 of the '887 provisional application, a disposal chamber assembly of which is shown in FIG. 18 of the '887 provisional application.

Such disposals are not designed to handle bottle caps, jar lids, or utensils such as a knife, fork, or spoon, let alone the occasional piece of jewelry, such as a wedding ring. Indeed, when such items are inadvertently dropped or otherwise fall into the disposal, the disposal breaks, the item is damaged or destroyed, or both.

In view of this, it is believed that a need exists for improvement in under-sink disposals in order to address the situation in which a utensil or other metallic object—including non-ferrous object—is accidentally dropped into or otherwise inadvertently enters the disposal. Such need is addressed in the solutions disclosed in U.S. Pat. Nos. 8,584,976 and 8,740,115, each of which is incorporated herein by reference; however, it is believed that additional improvements can yet be made in the manner and efficiency with which metallic objects are detected in the disposal, such as further focusing on filtering of noise and shielding of unwanted environmental effects. This—and other needs—are believed to be addressed by one or more aspects and features of the present invention.

SUMMARY OF THE INVENTION

The present invention generally relates to apparatus and methods for detecting unintended objects in under-sink disposals and, in particular, to apparatus and methods for detecting unintended objects—including both ferrous and non-ferrous objects—that fall through a throat of an under-sink disposal. Moreover, the present invention includes many aspects and features.

In an aspect of the invention, an under-sink disposal unit includes a motor, a disposal chamber, and a disposal throat. The disposal throat extends from the disposal chamber to an opening in a top of the disposal unit and defines a passageway through which objects pass into the disposal chamber for grinding. The disposal unit further includes a coil assembly comprising an arrangement of coils. The arrangement of coils is used to detect the passing of a metallic object in the passageway through the disposal throat. Furthermore, the arrangement of coils comprises at least one coil having a loop that is oriented with respect to an axis of the passageway through the disposal throat such that objects passing through the disposal throat into the disposal chamber pass by and proximate to, but do not pass through, such loop.

In a feature, the loop of the at least one coil of the arrangement comprises multiple windings of an electrically conductive wire.

In a feature, the disposal unit further includes a collar extending around the disposal throat to which the arrangement of coils are secured. In various further features: the collar completely encompasses the disposal throat; the collar is generally commensurate in extent with the disposal throat; the collar of the coil assembly extends between a locking ring whereat the disposal unit is attached to the underneath of a sink, and a top of the disposal chamber; the collar extends around the disposal throat along the entire extent of the disposal throat between the disposal chamber and the top of the disposal unit; and the collar extends around the disposal throat along the entire extent of the disposal throat along which the passageway is defined.

In a feature, the arrangement of coils includes: a first coil comprising a loop that is oriented with respect to an axis of the passageway through the disposal throat such that objects passing through the disposal throat into the disposal chamber pass by and proximate to, but do not pass through, the loop of the first coil; a second coil comprising a loop that is oriented with respect to the axis such that objects passing through the disposal throat into the disposal chamber pass by and proximate to, but do not pass through, the loop of the second coil; and a third coil comprising a loop that is oriented with respect to the axis such that objects passing through the disposal throat into the disposal chamber pass through the loop of the third coil. Moreover, the third coil preferably further comprises an additional loop that is oriented with respect to the axis such that objects passing through the disposal throat into the disposal chamber pass through the additional loop of the third coil, with one of the loops being located proximate a top of the coil assembly and the other loop being located proximate a bottom of the coil assembly. Still further, the loops of the third coil preferably are electrically connected in series, and each loop of the third coil preferably comprises multiple windings of an electrically conductive wire. In at least some embodiments, the third coil is a transmit coil, and the first and second coils are receiver coils. The first and second coils also preferably are not electrically connected in series or parallel. Furthermore, each coil preferably is respectively connected to a controller comprising circuitry used to detect, via the coil assembly, the passing of a metallic object in the passageway through the disposal throat. In furtherance to this respect, the controller preferably is configured to cut power to the motor of the disposal unit upon the detecting of the passing of a metallic object in the passageway through the disposal throat; or the motor is an alternating current motor, the disposal unit further includes an AC to DC converter, and the controller is configured to cause current to the motor to switch from alternating current to direct current from the AC to DC converter upon the detecting of the passing of a metallic object in the passageway through the disposal throat, whereby DC injection braking is performed.

In another feature, the arrangement of coils comprises of a plurality of coils, each of which includes a loop that is oriented with respect to an axis of the passageway through the disposal throat such that objects passing through the disposal throat into the disposal chamber pass by and proximate to, but do not pass through, such loop.

In another feature, the arrangement of coils comprises of a plurality of coils, none of which includes a loop that is oriented with respect to an axis of the passageway through the disposal throat such that objects passing through the disposal throat into the disposal chamber pass through such loop.

In another aspect, a method of controlling operation of a disposal unit includes the steps of: detecting the passing of a metallic object through a passageway of a disposal throat; and switching from alternating current to direct current for powering a motor of the disposal unit upon the detection of a metallic object passing through the disposal throat of the disposal unit, whereby DC injection braking is performed.

In a feature of this aspect, step (a) of the method is performed when a user activated switch for running the motor of the disposal unit is in the on position. Furthermore, step (a) of the method is performed only when the user activated switch is in the on position; or alternatively, step (a) of the method is further performed when the user activated switch is in the off position when power is otherwise supplied to the controller.

In still yet another aspect, a method of installing an under-sink disposal unit includes the steps of: providing an under-sink disposal unit as disclosed herein; connecting power to the motor of the disposal unit such that the power is toggled by a user activated switch; and connecting power to electronics of the under-sink disposal unit that actively detects passing of a metallic object through a disposal throat of the disposal unit, and that cuts power to the motor of the disposal unit upon the detection of a metallic object passing through a disposal throat of the disposal unit.

In another aspect, a method of installing an under-sink disposal unit includes the steps of: providing an under-sink disposal unit as disclosed herein; connecting power to the motor of the disposal unit such that the power is toggled by a user activated switch; and connecting power to electronics of the under-sink disposal unit that actively detects passing of a metallic object through a disposal throat of the disposal unit, and that switches from alternating current to direct current in powering the motor of the disposal unit upon the detection of a metallic object passing through a disposal throat of the disposal unit, whereby DC injection braking is performed.

In an aspect, an under-sink disposal installation comprises a sink; and an under-sink disposal unit as disclosed herein.

In another aspect of the invention, an under-sink disposal installation comprises a sink; and an under-sink disposal unit comprising: (i) a motor, (ii) a disposal chamber, (iii) a disposal throat, wherein the disposal throat extends from the disposal chamber to an opening in a top of the disposal unit and defines a passageway through which objects pass into the disposal chamber for grinding, and (iv) a coil assembly comprising an arrangement of coils. The arrangement of coils is used to detect the passing of a metallic object in the passageway through the disposal throat, and the arrangement of coils comprises at least one coil having a loop that is oriented with respect to an axis of the passageway through the disposal throat such that objects passing through the disposal throat into the disposal chamber pass by and proximate to, but do not pass through, such loop.

In a feature, the disposal unit further comprises a cowling enclosing the motor, the disposal chamber, and the disposal throat.

Still further features of the present invention are disclosed in the incorporated provisional application, including in the models of the Computer Program Listing of the Appendix of the '887 provisional application; and in the incorporated patents.

Other aspects of the invention comprise methods of using apparatus of the foregoing aspects.

Still other aspects comprise kits for up-fitting conventional disposal systems. Alternatively, one or more of the foregoing aspects and features can be integrated into a disposal system as manufactured and provided by an "OEM".

In addition to the aforementioned aspects and features of the present invention, it should be noted that the present invention further encompasses the various possible combinations and subcombinations of such aspects and features. Thus, for example, any aspect may be combined with an aforementioned feature in accordance with the present invention without requiring any other aspect or feature.

BRIEF DESCRIPTION OF THE DRAWINGS

One or more preferred embodiments of the present invention now will be described in detail with reference to the accompanying drawings, wherein the same elements are referred to with the same reference numerals.

DETAILED DESCRIPTION

Figure 1:
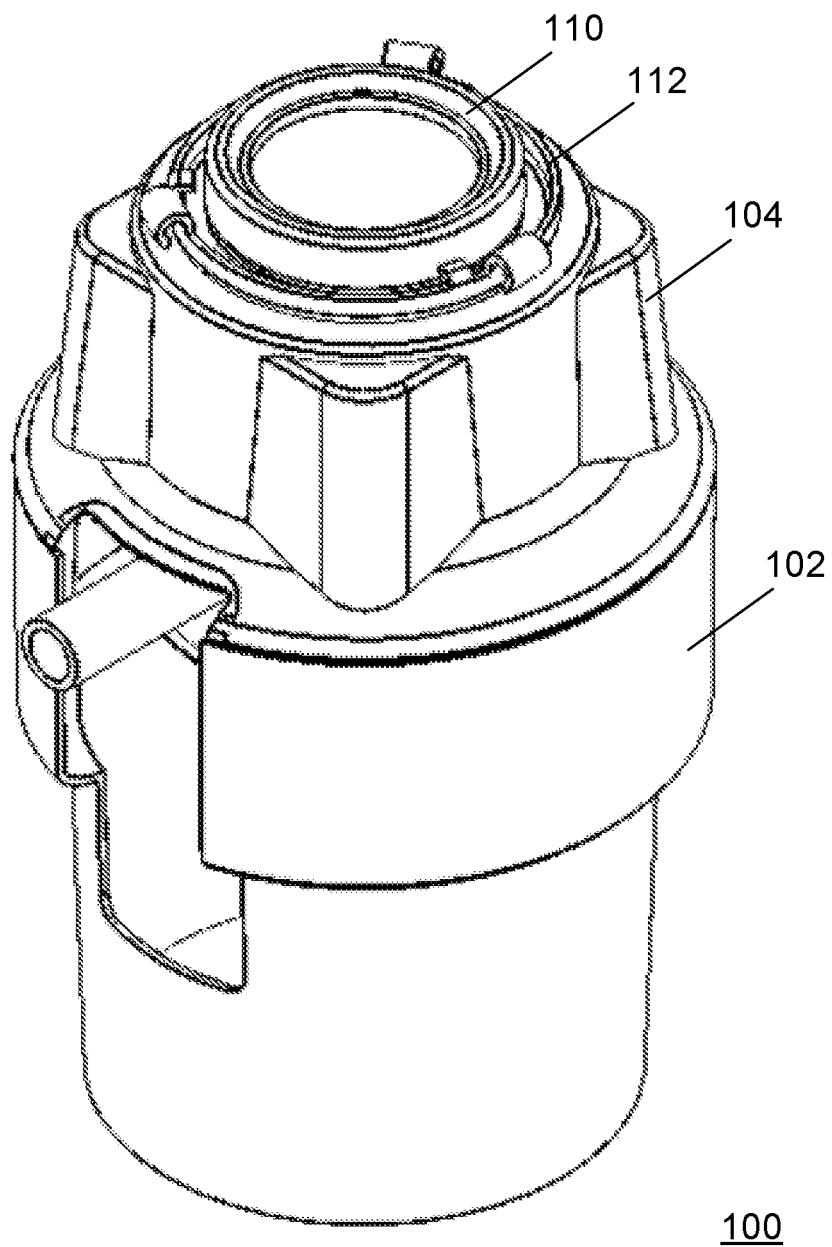
FIG. 1 is a schematic illustration of an isometric view of an under-sink disposal unit in accordance with a preferred embodiment of the present invention, wherein a wall of a cowling base of the unit is partially cutaway, and wherein the motor contained in the cowling base has been omitted.

As a preliminary matter, it will readily be understood by one having ordinary skill in the relevant art ("Ordinary Artisan") that the invention has broad utility and application. Furthermore, any embodiment discussed and identified as being "preferred" is considered to be part of a best mode contemplated for carrying out the invention. Other embodiments also may be discussed for additional illustrative purposes in providing a full and enabling disclosure of the invention. Furthermore, an embodiment of the invention may incorporate only one or a plurality of the aspects of the invention disclosed herein; only one or a plurality of the features disclosed herein; or combination thereof. As such, many embodiments are implicitly disclosed herein and fall within the scope of what is regarded as the invention.

Accordingly, while the invention is described herein in detail in relation to one or more embodiments, it is to be understood that this disclosure is illustrative and exemplary of the invention, and is made merely for the purposes of providing a full and enabling disclosure of the invention. The detailed disclosure herein of one or more embodiments is not intended, nor is to be construed, to limit the scope of patent protection afforded the invention in any claim of a patent issuing here from, which scope is to be defined by the claims and the equivalents thereof. It is not intended that the scope of patent protection afforded the invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the invention. Accordingly, it is intended that the scope of patent protection afforded the invention is to be defined by the issued claim(s) rather than the description set forth herein.

Additionally, it is important to note that each term used herein refers to that which the Ordinary Artisan would understand such term to mean based on the contextual use of such term herein. To the extent that the meaning of a term used herein-as understood by the Ordinary Artisan based on the contextual use of such term-differs in any way from any particular dictionary definition of such term, it is intended that the meaning of the term as understood by the Ordinary Artisan should prevail.

Regarding applicability of 35 U.S.C. 112, paragraph 6 or subsection (f), no claim element is intended to be read in accordance with this statutory provision unless the explicit phrase "means for" or "step for" is actually used in such claim element, whereupon this statutory provision is intended to apply in the interpretation of such claim element.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." When used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, one or more preferred embodiments of the invention are next described. The following description of one or more preferred embodiments is merely exemplary in nature and is in no way intended to limit the invention, its implementations, or uses.

Turning now to FIG. 1, an under-sink disposal unit 100 in accordance with a preferred embodiment of the present invention is schematically illustrated in isometric view. It will be appreciated that in FIG. 1, a wall of a cowling base 102 of the unit 100 is partially cutaway, and the AC motor that normally would be found contained in the cowling base has been omitted in the illustration.

Figure 2:
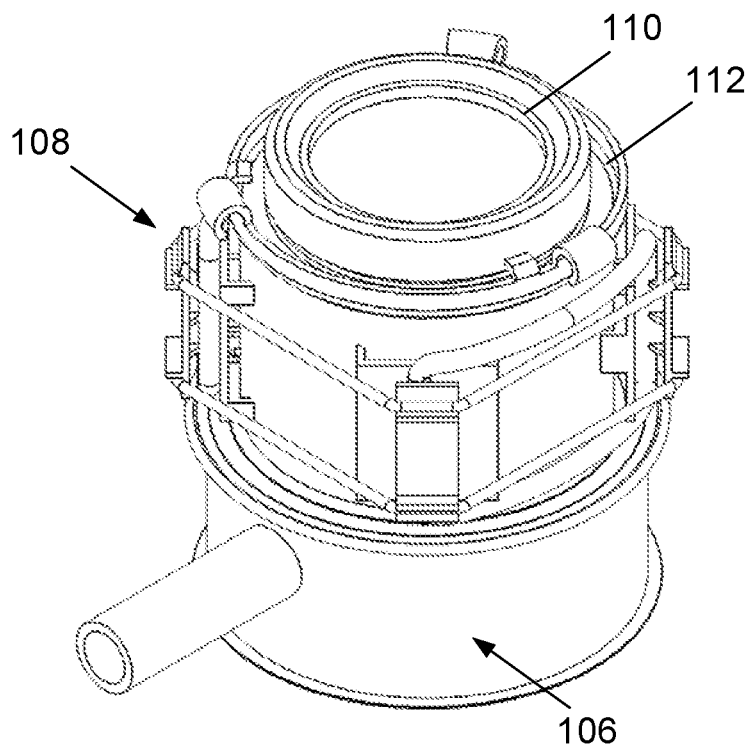
FIG. 2 is a schematic illustration of an isometric view of the disposal chamber assembly, the coil assembly, a gasket, and a locking ring of the under-sink disposal unit of FIG. 1.

FIG. 2 is a schematic illustration of an isometric view of the disposal chamber assembly 106, the coil assembly 108, the gasket 110, and the locking ring 112 of the under-sink disposal unit 100.

Figure 3:
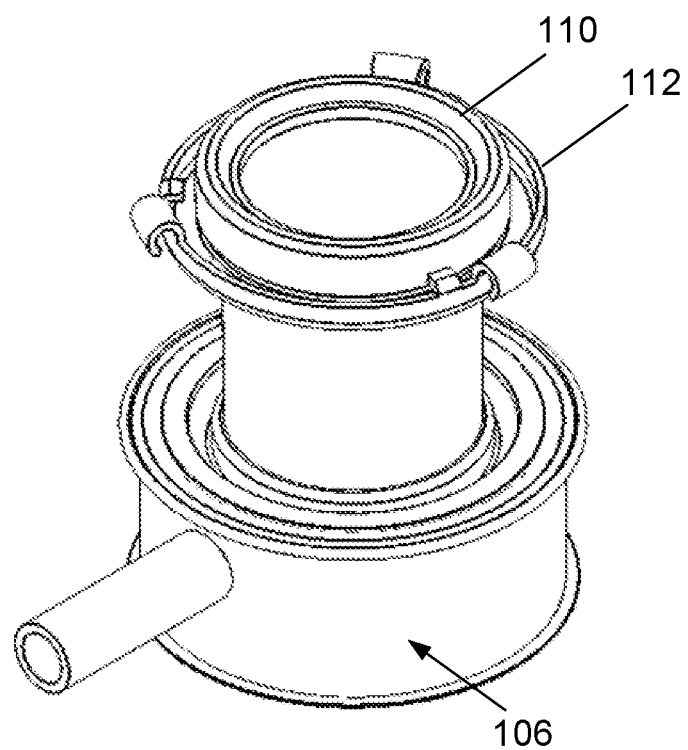
FIG. 3 is a schematic illustration similar to that of FIG. 2, wherein the coil assembly has been omitted.

FIG. 3 is a schematic illustration similar to that of FIG. 2, wherein the coil assembly 108 has been omitted.

Figure 4:
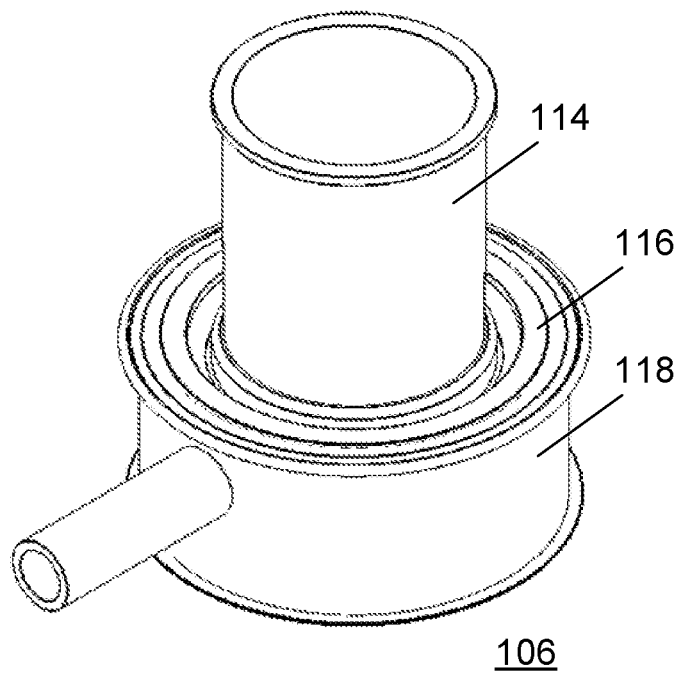
FIG. 4 is a schematic illustration similar to that of FIG. 3, wherein the gasket and locking ring have been omitted and only a subassembly comprising a disposal chamber, a disposal throat, and a dampener of the under-sink disposal unit of FIG. 1 are shown.

FIG. 4 is a schematic illustration similar to that of FIG. 3, wherein the gasket 110 and locking ring 112 have been omitted, and wherein only the disposal chamber assembly 106 is shown. The disposal chamber assembly 106 comprises a disposal throat 114, and a dampener 116, and a disposal chamber 118.

Figure 5:
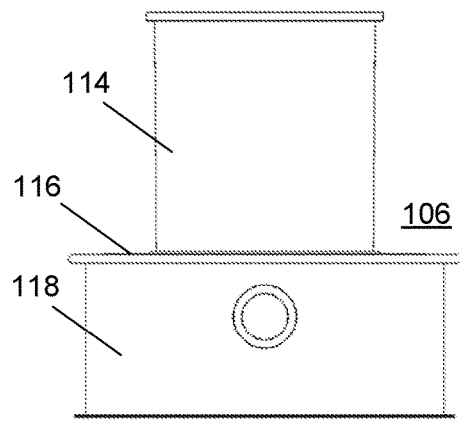
FIG. 5 is a schematic illustration of a front elevational view of the subassembly of FIG. 4 comprising the disposal chamber, the disposal throat, and the dampener.
Figure 6:
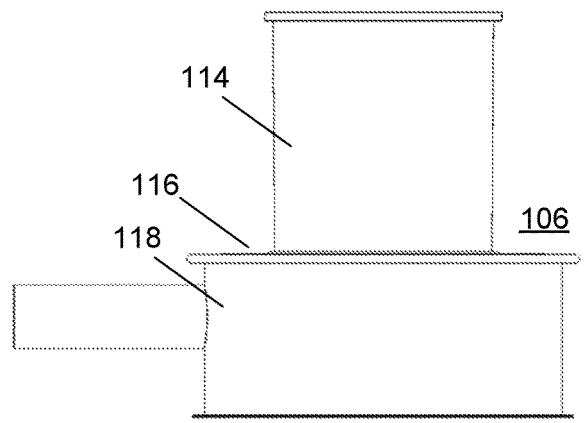
FIG. 6 is a schematic illustration of a right elevational view of the subassembly of FIG. 4 comprising the disposal chamber, the disposal throat, and the dampener.
Figure 7:
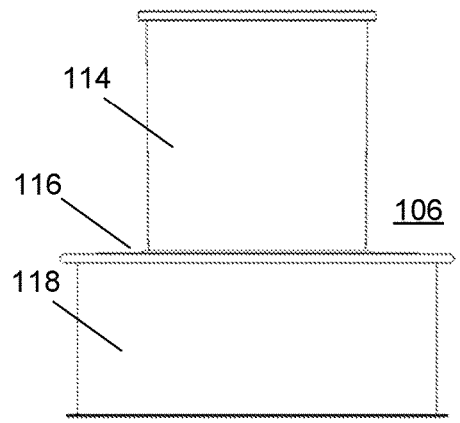
FIG. 7 is a schematic illustration of a back elevational view of the subassembly of FIG. 4 comprising the disposal chamber, the disposal throat, and the dampener.
Figure 8:
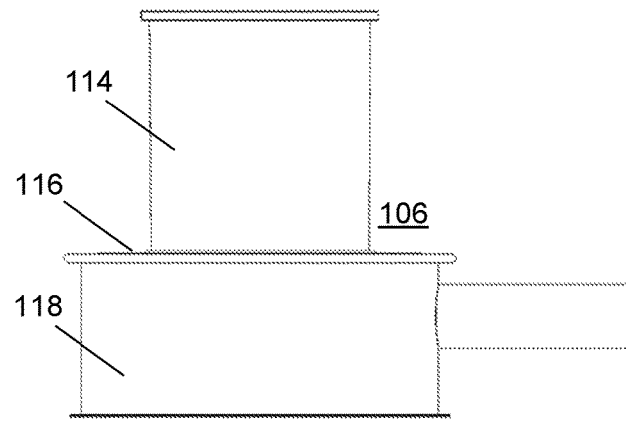
FIG. 8 is a schematic illustration of a left elevational view of the subassembly of FIG. 4 comprising the disposal chamber, the disposal throat, and the dampener.
Figure 9:
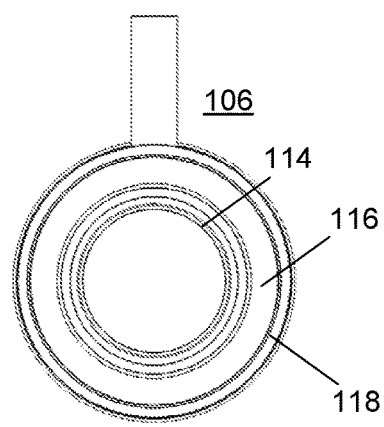
FIG. 9 is a schematic illustration of a bottom view of the subassembly of FIG. 4 comprising the disposal chamber, the disposal throat, and the dampener.
Figure 10:
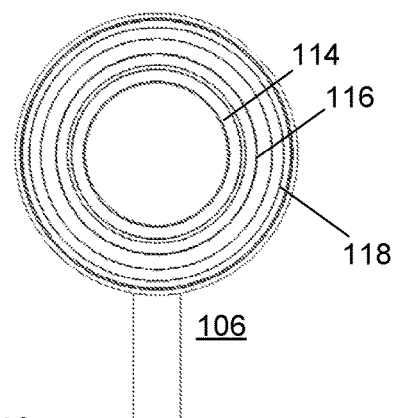
FIG. 10 is a schematic illustration of a top view of the subassembly of FIG. 4 comprising the disposal chamber, the disposal throat, and the dampener.

FIG. 5 is a schematic illustration of a front elevational view of the disposal chamber subassembly 106 comprising the disposal throat 114, the dampener 116, and the disposal chamber 118; FIG. 6 is a schematic illustration of a right elevational view of the subassembly 106; FIG. 7 is a schematic illustration of a back elevational view of the subassembly 106; FIG. 8 is a schematic illustration of a left elevational view of the subassembly 106; FIG. 9 is a schematic illustration of a bottom view of the subassembly 106; and FIG. 10 is a schematic illustration of a top view of the subassembly 106.

Figure 11:
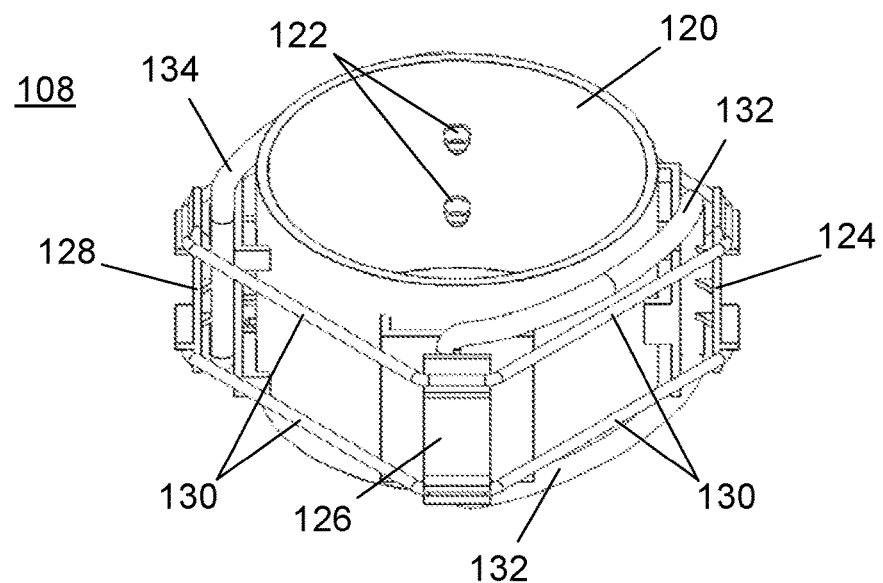
FIG. 11 is a schematic illustration similar to that of FIG. 2, wherein all but the coil assembly has been omitted.

FIG. 11 is a schematic illustration similar to that of FIG. 2, wherein all but the coil assembly 108 has been omitted.

The coil assembly 108 comprise a collar 120, four brackets 122,124,126,128, a first coil 130 of conductive wire, and second coils 132,134 of conductive wires. The first coil 130 is arranged in two concentric loops relative to an axis 500 of the passageway of the disposal throat 114, with one being proximate the top of the collar 120 and the other being proximate the bottom of the collar 120, each loop comprising multiple wrappings of the wire that define a bundle. Accordingly, it will be appreciated that objects passing through the disposal throat 114 pass through the loops of the first coil 130. Moreover, the two loops of the first coil 130 are electrically connected in series, effectively making them a continuous line. The first coil 130 preferably serves as the transmit coil.

In contrast, the coils 132,134 serve as receiver coils, and each comprises a bundled loop with the coils 132,134 being located on opposite sides of the disposal throat 120. Unlike the loops of the coil 130, the loops of coils 132,134 are electrically separate and are not concentric relative to the axis 500 of the passageway of the disposal throat 114. Instead, the loops of the coils 132,134 are orthogonally oriented to such axis 500, whereby objects passing through the disposal throat 114 pass by and proximate to, but do not pass through, the loops of the coils 132,134.

Figure 12:
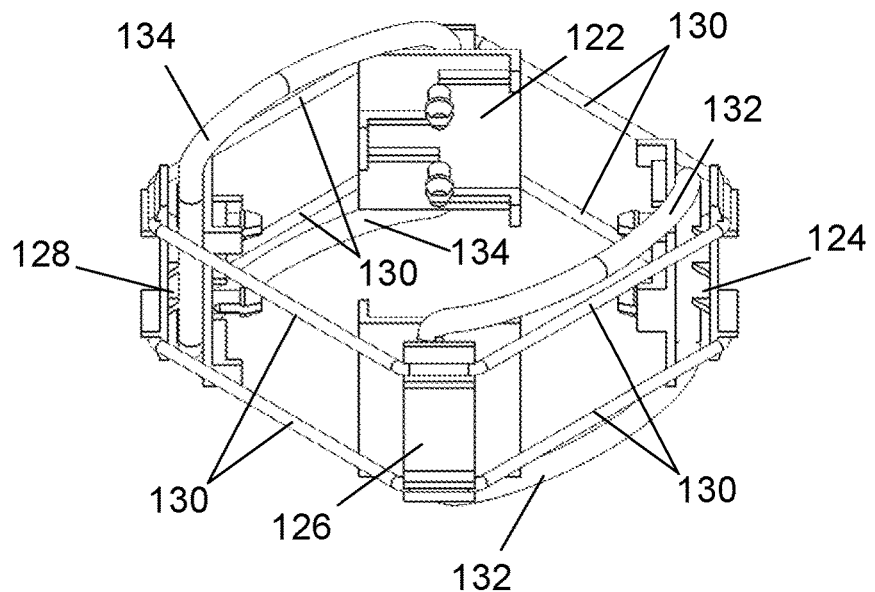
FIG. 12 is a schematic illustration of an isometric view of the coils and brackets of the coil assembly of the under-sink disposal unit of FIG. 1.

FIG. 12 is a schematic illustration of an isometric view of the coils 130,132,134 and brackets 122,124,126,128 of the coil assembly 108 of the under-sink disposal unit 100.

Figure 13:
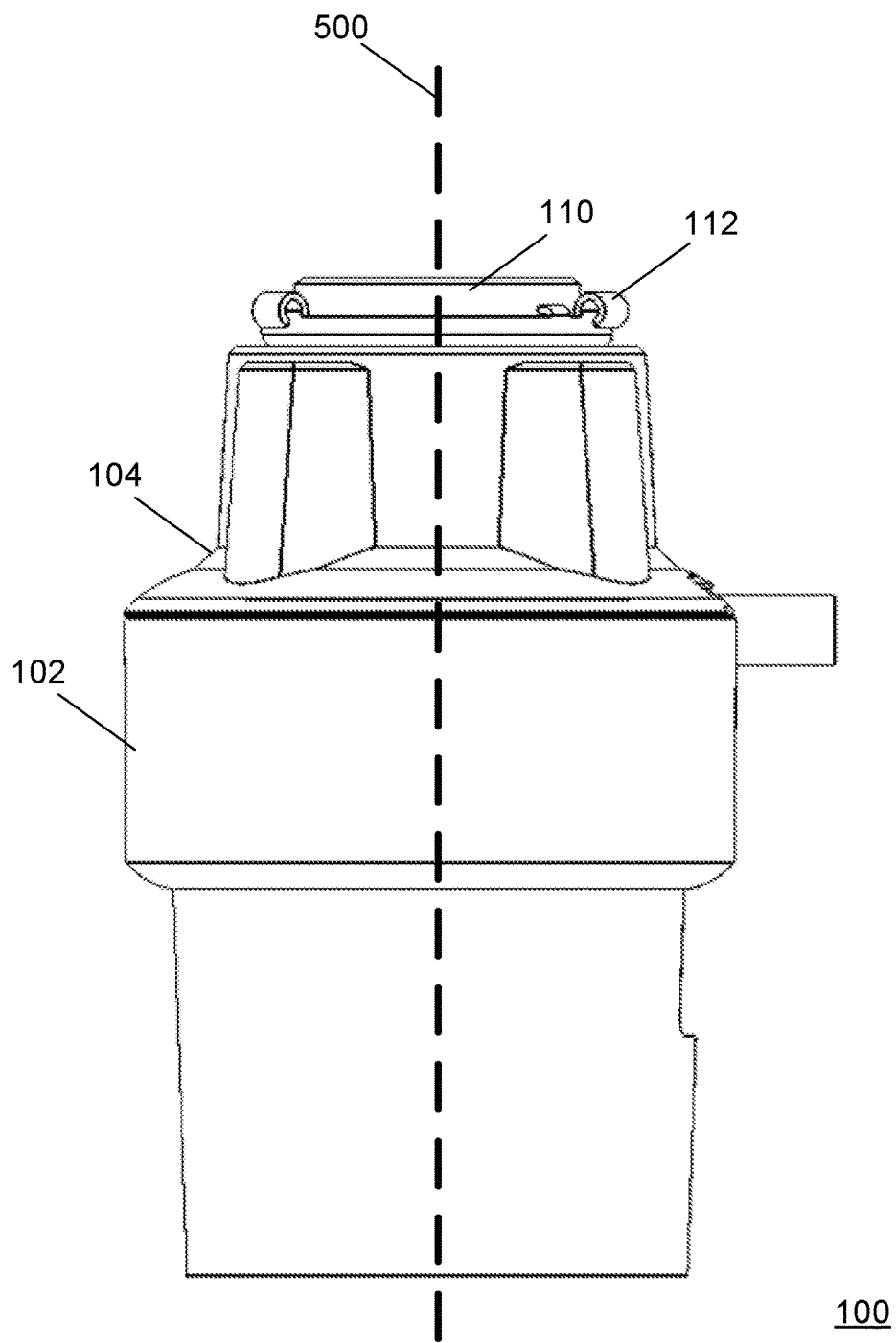
FIG. 13 is a side elevational view of the under-sink disposal unit of FIG. 1.

FIG. 13 is a side elevational view of the under-sink disposal unit 100. The cowling base 102 and cowling cap 104 enclose the disposal chamber assembly 106 and the coil assembly 108, as well as a motor of the disposal unit 100, which motor has been omitted from the drawings for clarity of illustration.

It will be appreciated that the coil assembly 108 is located about the disposal throat 114 at an elevation above the disposal chamber 118 whereby detection of a metallic object utilizing the coil assembly 108 will provide a lead time in which to cutoff AC power to the motor before the metallic object reaches the grinding mechanism located within the disposal chamber 118 of the disposal unit 100. Further operation of the disposal is disclosed in greater detail below with reference to FIGS. 15-18.

Figure 14:
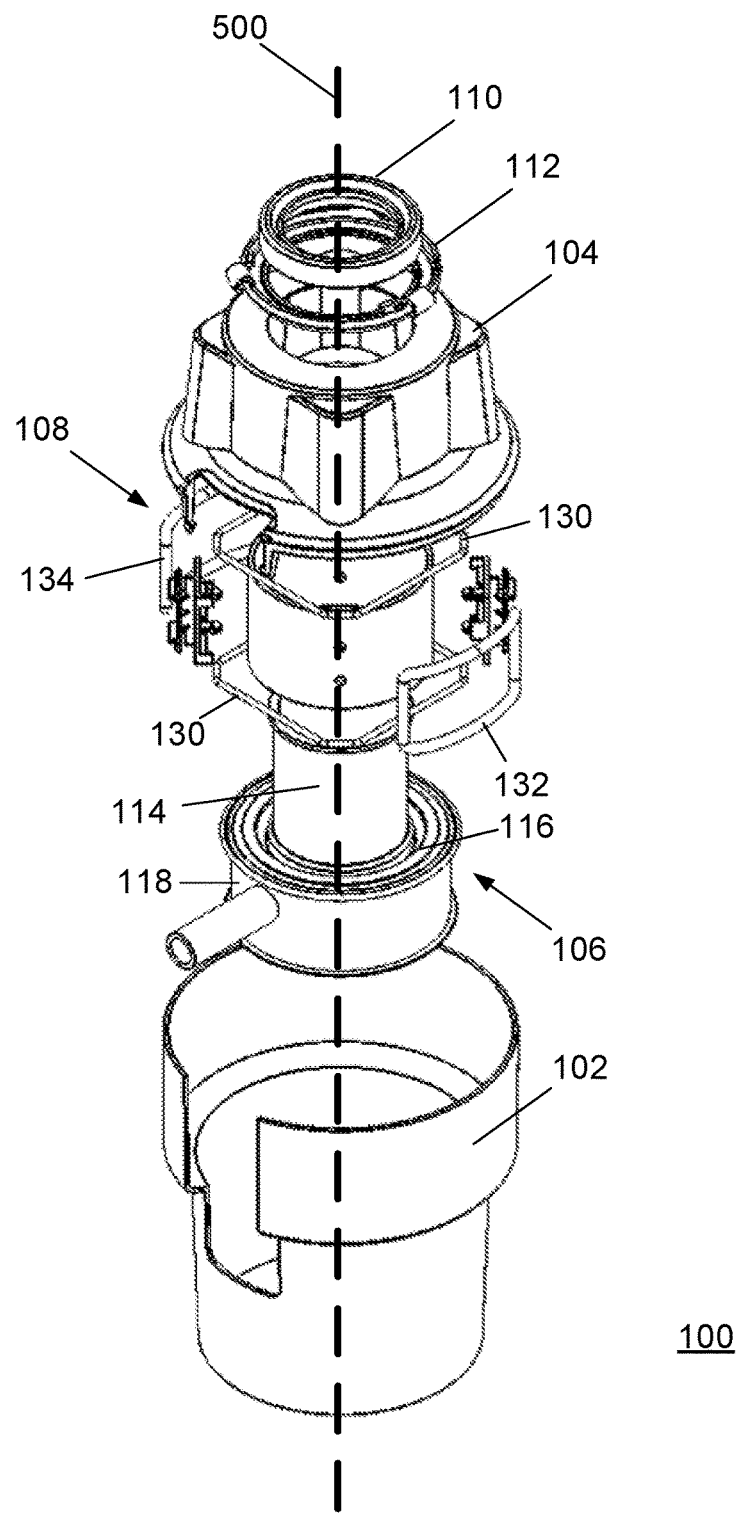
FIG. 14 is a schematic illustration of an isometric, exploded view of the under-sink disposal unit of FIG. 1.

FIG. 14 is a schematic illustration of an isometric, exploded view of the under-sink disposal unit 100 of FIG. 1.

Figure 15:
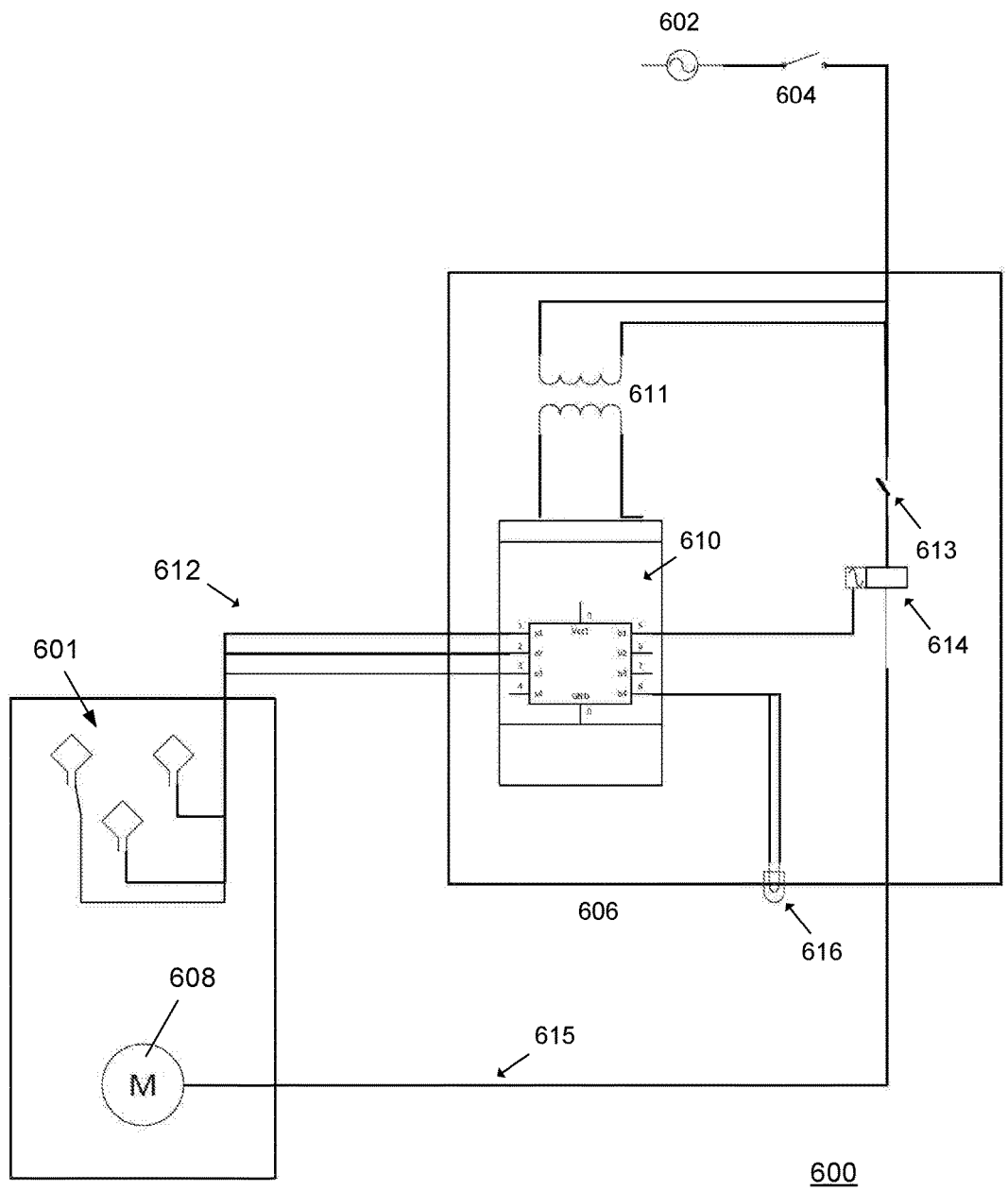
FIG. 15 is a circuit diagram for stopping operation of the disposal unit in accordance with a preferred embodiment of the present invention, wherein power is supplied to the motherboard and control circuitry only when the user activated switch is in the 'on' position.

FIG. 15 is a circuit diagram 600 for stopping operation of a disposal unit in accordance with a preferred embodiment of the present invention. As represented in this circuit diagram, electrical power in the form of alternating current (AC) is provided via line voltage 602, which power is turned on to the disposal unit by a user activated switch 604. When the user activated switch is turned on, both the electronics of an electronics box 606 and the motor 608 of the disposal unit are powered; when the user activated switch is turned off, neither the electronics nor the motor is powered. In particular, the line voltage powers a motherboard 610 in an electronics box that includes a controller via a power supply 611, and the line voltage powers a motor of the disposal unit indicated by 'M' in FIG. 15 via motor power line 615. The controller is connected to and disposed in electronic communications with a coil assembly 601 of the disposal unit via the signal wire bundle 612. When a metallic object is detected passing through the throat of the disposal unit, which is detected via the coil assembly, the controller cuts power to the motor via the normally closed (NC) relay 614. A 15 amp, 120 volt fuse 613 precedes the relay. An LED 616 is represented in the circuit diagram that is activated to indicate that the controller has cut power to the motor of the disposal unit.

Continuing with reference to FIG. 15, the coil assembly shown is representative of a three-coil assembly such as, for example, coil assembly 108 of FIG. 11. Such a coil assembly is believed to be particularly well suited for detecting metallic objects, including non-ferrous metallic objects, and represents a preferred coil assembly in accordance with the present invention.

The power to the motor of the disposal unit is restored by moving the user activated switch to the off position and then back to the on position. From the circuit diagram of FIG. 15, it will be appreciated that the power is supplied to the motherboard and control circuitry only when the user activated switch is in the on position and, consequently, a metallic object passing through the throat of the disposal will not be detected when the user activated switch is in the off position.

It is believed that it is advantageous to be able to detect when a metallic object passes through the disposal throat even when the motor of the disposal unit is not running. Operation of a disposal unit in accordance with the circuit diagram 700 of FIG. 16 is believed to provide such an advantage; however, the installation of a disposal unit that operates in accordance with the circuit diagram of FIG. 15 is believed to be simpler than the installation of the disposal unit that operates in accordance with the circuit diagram of FIG. 16.

Figure 16:
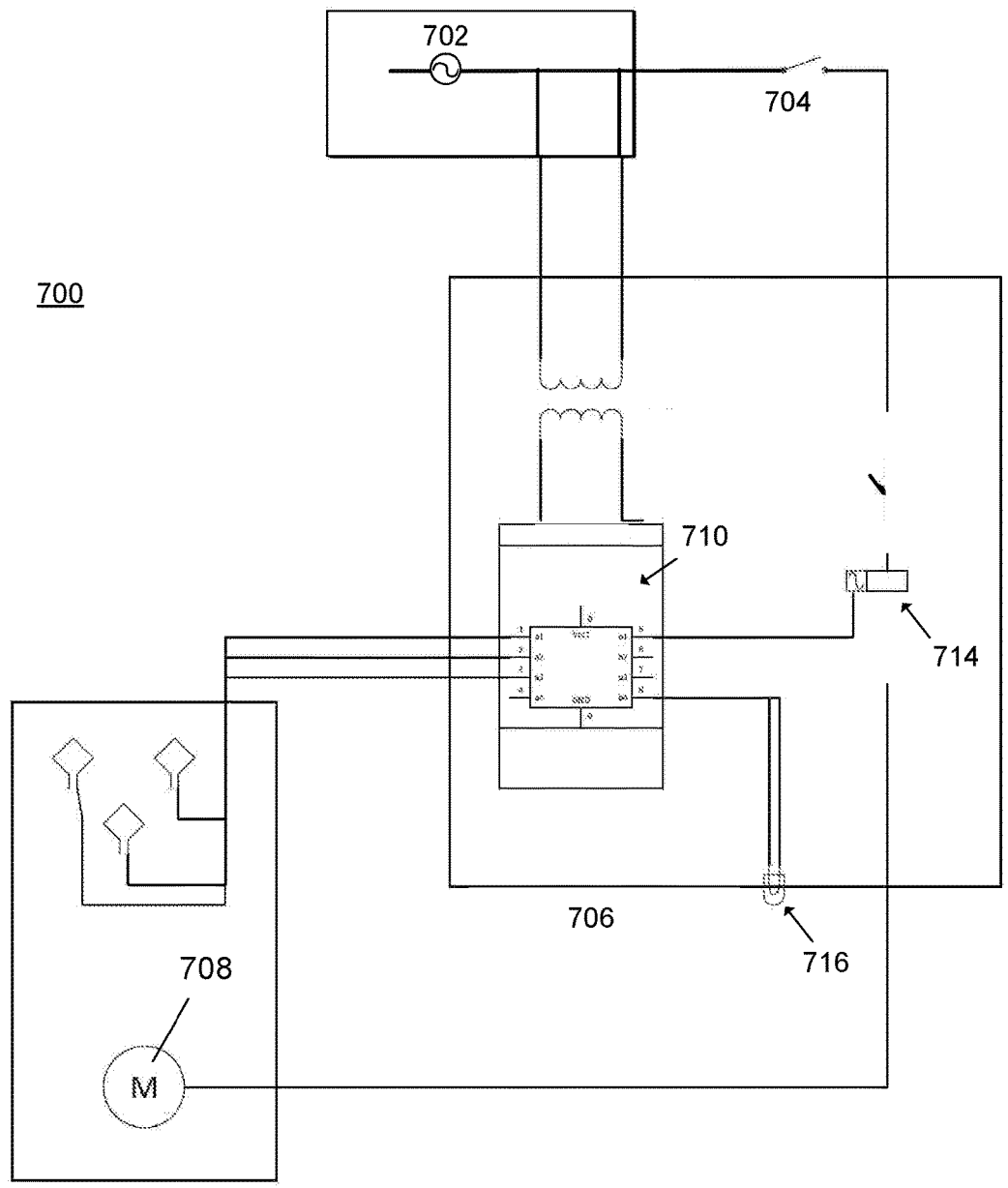
FIG. 16 is a circuit diagram for stopping operation of the disposal unit in accordance with another preferred embodiment of the present invention, wherein power is supplied to the motherboard and control circuitry regardless of the position of the user activated switch.

With regard to the circuit diagram of FIG. 16, the line voltage 702 is shown as powering the electronics of the electronics box 706 including the motherboard 710 prior to the user activated switch 704. The circuit diagram is similar to that of FIG. 15, and differs in part in that the power supply for the detection board is simply moved to a permanently installed line voltage. All other functions generally remain the same, as will be appreciated from review of the circuit diagram 700. The user activated switch is used to toggle power to the motor 708 of the disposal unit by a user during normal operation of the disposal unit. When a metallic object is detected as passing through the throat of the disposal, the controller breaks the electrical path supplying power to the motor at the normally closed (NC) relay 714. The passing of a metallic object is detected even when the user activated switch is in the off position with the motor off during times when a user is not using or intending to use the disposal unit. The LED 716 is illuminated to indicate that the passing of a metallic object has been detected, whereby a user will know that the failure of the motor to start when the switch is turned on is a result of the controller and not a malfunction of the disposal unit or general loss of electric power. A reset (not shown) preferably is provided by which a user resets the controller and the relay is moved to the normally closed position for powering of the motor when the user activated switch is turned on.

Figure 17:
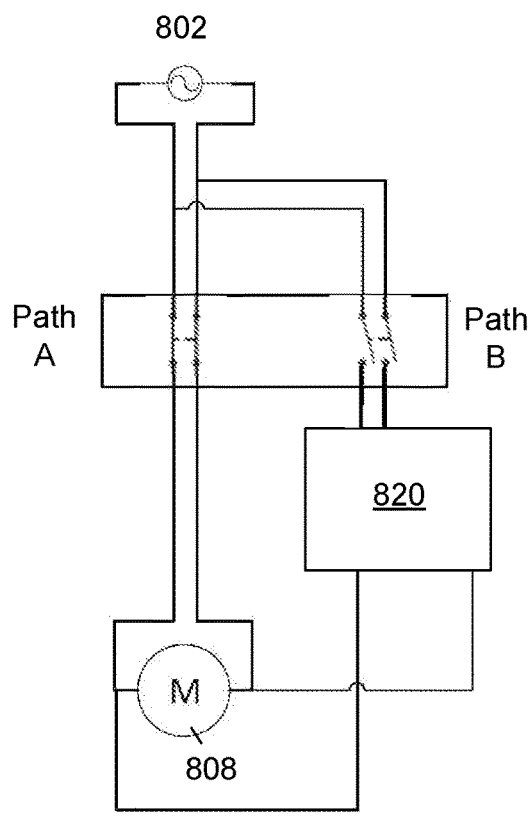
FIG. 17 is a circuit diagram in accordance with a preferred embodiment of the present invention, wherein normal powering of the motor of the disposal unit is represented.
Figure 18:
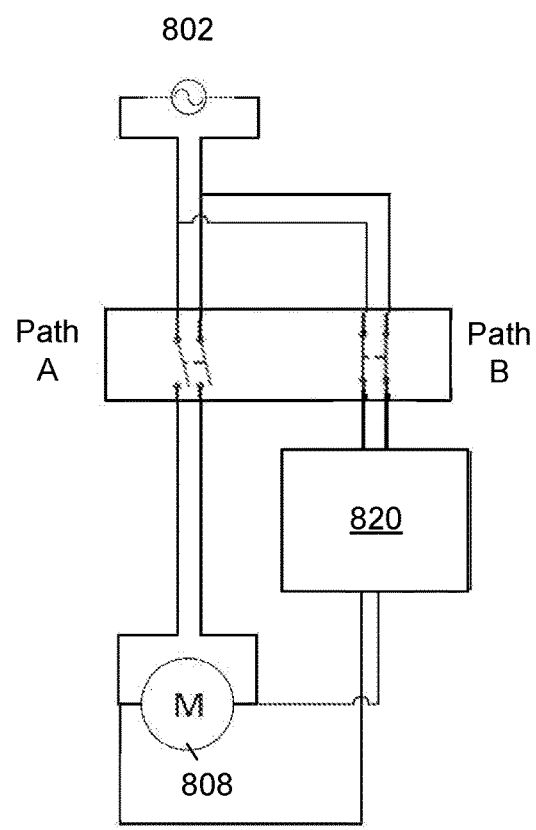
FIG. 18 is the circuit diagram of FIG. 17, wherein DC injection braking is represented for stopping the motor of the disposal unit following detection of a metallic object passing through the throat of the disposal unit.

FIGS. 17 and 18 are circuit diagrams showing powering of the disposal unit and the use of DC injection braking for stopping the motor of the disposal unit when a metallic object passing through the throat of the disposal unit has been detected. The DC injection braking is done as an alternative to cutting power to the motor of the disposal, as represented in the circuit diagrams of FIGS. 15 and 16. The circuit diagrams of FIGS. 17 and 18 thus represent the portion of the circuit diagrams of FIGS. 15 and 16, including the NC relay, which would be replaced when DC injection braking is utilized. In this regard, the controller controls switching between Path A (for normal powering of the motor, as shown in FIG. 17) and Path B (for DC injection braking as shown in FIG. 18). During normal operation, the alternating current 802 from the wall power enables the AC motor 808 to spin. The electrical pathway is through Path A. During DC injection braking, the path of electricity is diverted through parallel Path B, wherein the AC current passes through a current converter 820 changing the AC current to DC current. It is believed that DC injection braking would further reduce if not completely prevent damage to a metallic object by actively halting the grinding mechanism rather than merely allowing the grinding mechanism to passively come to a stop after cutting power to the motor via the NC relay.

With particular regard to functioning of the electronics, numerous methods can be utilized in the circuitry for detecting metallic objects. The primary method of metal detection is to detect a disturbance in a magnetic field. Preferably, the method used in preferred embodiments of the disposal unit comprises a "pulsed wave" system. The primary components utilized in this type of system are at least two coils, i.e., one or more transmit coil(s) and receiver coil(s)); a timer; an amplifier; and a comparing circuit. The fundamental operation is as follows.

The timer activates current to pass through the transmit coil(s) through the amplifier. This allows for enough current to pass through the transmit coil(s) to generate a relatively large magnetic field about the transmit coil(s). The timer then shuts off the current through the transmit coil(s). The comparing circuit then compares the measured current from the receive coils to a known or expected value. If there is a conductive object within the field energized by the transmit coil(s), eddy currents will be developed within the object. Once current through the transmit coil(s) is shut off, the eddy currents in the metallic object will continue to emit a magnetic field until stopped by the internal resistance of the metallic object. The magnetic field produced from the eddy currents in the metallic object will induce a current in the receive coils. The current registers as a voltage. If a metallic object is within the field and induces a current on the receive coils, then the voltage of the receive coils will deviate from the expected value and it can be determined that a metallic object is within the field of detection.

In the disposal unit, the controller preferably is a microcontroller which acts, among other things, as a timer. The microcontroller controls the current through the transmit coil(s). In particular, the microcontroller cannot supply the necessary current to the transmit coil(s) so an amplifier circuit is provided to drive the transmit coil(s). The two receiver coils are provided, with a first being connected to the positive terminal of a summing circuit and the other being attached to the negative terminal. Under normal operating conditions, the two receive coils read the same response and cancel each other out; however, if a conductive object passes through the field of the transmitter (like a metallic object passing through the drain throat), then one of the coils offsets the other and a deflection from zero occurs. If this deflection is greater than the statistical noise floor, then the microcontroller reads a detection of an unintended object passing through the disposal throat. Upon reading a detection, the microcontroller sends a signal to the power relay. The power relay is located electrically between the wall power and the motor of the disposal. When signaled by the microcontroller, the relay opens and powering of the motor of the disposal is stopped.

Based on the foregoing description, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements, the present invention being limited only by the claims appended hereto and the equivalents thereof.

What is claimed is:

1. An under-sink disposal unit, comprising a motor, a disposal chamber having a grinding area at a bottom thereof, and a disposal throat, wherein the disposal throat extends from the disposal chamber to an opening in a top of the disposal unit and defines a passageway through which objects pass into the disposal chamber toward the grinding area for grinding, and further comprising
(a) a coil assembly comprising an arrangement of coils,
(b) wherein the arrangement of coils is used to detect the passing of a metallic object through the disposal throat into the disposal chamber toward the grinding area, and
(c) wherein the arrangement of coils comprises, (i) a first coil comprising a loop that is oriented with respect to an axis of the passageway through the disposal throat such that objects passing through the disposal throat into the disposal chamber pass by and proximate to, but do not pass through, the loop of the first coil, (ii) a second coil comprising a loop that is oriented with respect to the axis such that objects passing through the disposal throat into the disposal chamber pass by and proximate to, but do not pass through, the loop of the second coil, and (iii) a third coil comprising a loop that is oriented with respect to the axis such that objects passing through the disposal throat into the disposal chamber pass through the loop of the third coil.

2. The under-sink disposal unit of claim 1, wherein at least one loop of the arrangement of coils comprises multiple windings of an electrically conductive wire.

3. The under-sink disposal unit of claim 1, further comprising a collar extending around the disposal throat to which the arrangement of coils is secured.

4. The under-sink disposal unit of claim 3, wherein the collar completely encompasses the disposal throat.

5. The under-sink disposal unit of claim 3, wherein the collar is generally commensurate in extent with the disposal throat.

6. The under-sink disposal unit of claim 3, wherein the collar of the coil assembly extends between a locking ring whereat the disposal unit is attached to the underneath of a sink, and a top of the disposal chamber.

7. The under-sink disposal unit of claim 3, wherein the collar extends around the disposal throat along the entire extent of the disposal throat between the disposal chamber and the top of the disposal unit.

8. The under-sink disposal unit of claim 3, wherein the collar extends around the disposal throat along the entire extent of the disposal throat along which the passageway is defined.

9. The under-sink disposal unit of claim 1, wherein the third coil further comprises an additional loop that is oriented with respect to the axis such that objects passing through the disposal throat into the disposal chamber toward the grinding area pass through the additional loop of the third coil.

10. The under-sink disposal unit of claim 9, wherein the loops of the third coil are electrically connected in series.

11. The under-sink disposal unit of claim 9, wherein each loop of the third coil comprises multiple windings of an electrically conductive wire.

12. The under-sink disposal unit of claim 9, wherein the third coil is a transmit coil, and wherein the first and second coils are receiver coils.

13. The under-sink disposal unit of claim 9, wherein the first and second coils are not electrically connected in series or parallel.

14. The under-sink disposal unit of claim 9, wherein each coil is respectively connected to a controller comprising circuitry used to detect, via the coil assembly, the passing of a metallic object through the disposal throat into the disposal chamber toward the grinding area.

15. The under-sink disposal unit of claim 14, wherein the controller is configured to cut power to the motor of the disposal unit upon the detecting of the passing of a metallic object through the disposal throat into the disposal chamber toward the grinding area.

16. The under-sink disposal unit of claim 14, wherein the motor is an alternating current motor, wherein the disposal unit further comprises an AC to DC converter, and wherein the controller is configured to cause current to the motor to switch from alternating current to direct current from the AC to DC converter upon the detecting of the passing of a metallic object through the disposal throat into the disposal chamber toward the grinding area, whereby DC injection braking is performed.

17. A method of installing an under-sink disposal unit, comprising:
    (a) providing the under-sink disposal unit of claim 1;
    (b) connecting power to the motor of the disposal unit such that the power is toggled by a user activated switch; and
    (c) connecting power to electronics of the under-sink disposal unit that actively detects passing of a metallic object through a disposal throat into the disposal chamber toward the grinding area of the disposal unit, and that cuts power to the motor of the disposal unit upon the detection of a metallic object passing through the disposal throat into the disposal chamber toward the grinding area of the disposal unit.

18. A method of installing an under-sink disposal unit, comprising:
    (a) providing an under-sink disposal unit of claim 1;
    (b) connecting power to the motor of the disposal unit such that the power is toggled by a user activated switch; and
    (c) connecting power to electronics of the under-sink disposal unit that actively detects passing of a metallic object through a disposal throat into the disposal chamber toward the grinding area of the disposal unit, and that switches from alternating current to direct current in powering the motor of the disposal unit upon the detection of a metallic object passing through the disposal throat into the disposal chamber toward the grinding area of the disposal unit, whereby DC injection braking is performed.

19. An under-sink disposal installation, comprising:
    (a) a sink; and
    (b) an under-sink disposal unit comprising,
        (i) a motor,
        (ii) a disposal chamber having a grinding area at a bottom thereof,
        (iii) a disposal throat that extends from the disposal chamber to an opening in a top of the disposal unit and defines a passageway through which objects pass into the disposal chamber toward the grinding area for grinding, and
        (iv) a coil assembly comprising an arrangement of coils used to detect the passing of a metallic object through the disposal throat into the disposal chamber toward the grinding area, the arrangement of coils comprising,
            (A) a first coil comprising a loop that is oriented with respect to an axis of the passageway through the disposal throat such that objects passing through the disposal throat into the disposal chamber pass by and proximate to, but do not pass through, the loop of the first coil,
            (B) a second coil comprising a loop that is oriented with respect to the axis such that objects passing through the disposal throat into the disposal chamber pass by and proximate to, but do not pass through, the loop of the second coil, and
            (C) a third coil comprising a loop that is oriented with respect to the axis such that objects passing through the disposal throat into the disposal chamber pass through the loop of the third coil.

20. The under-sink disposal installation of claim 19, wherein the disposal unit further comprises a cowling enclosing the motor, the disposal chamber, and the disposal throat.

\* \* \* \* \*